(12) United States Patent
Edelstein et al.

(10) Patent No.: US 9,583,410 B2
(45) Date of Patent: Feb. 28, 2017

(54) VOLUMETRIC INTEGRATED CIRCUIT AND VOLUMETRIC INTEGRATED CIRCUIT MANUFACTURING METHOD

(71) Applicant: International Business Machines Corporation, Armonk, NY (US)

(72) Inventors: Daniel C. Edelstein, White Plains, NY (US); Michael A. Gaynes, Vestal, NY (US); Thomas M. Shaw, Peekskill, NY (US); Bucknell C. Webb, Ossining, NY (US); Roy R. Yu, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 91 days.

(21) Appl. No.: 14/221,477

(22) Filed: Mar. 21, 2014

(65) Prior Publication Data
US 2015/0270246 A1 Sep. 24, 2015

(51) Int. Cl.
*H01L 23/29* (2006.01)
*H01L 23/31* (2006.01)

(52) U.S. Cl.
CPC .......... *H01L 23/293* (2013.01); *H01L 23/291* (2013.01); *H01L 23/3171* (2013.01); *H01L 23/3192* (2013.01); *H01L 2224/11* (2013.01)

(58) Field of Classification Search
CPC H01L 25/0652; H01L 21/8221; H01L 25/043
See application file for complete search history.

(56) References Cited

U.S. PATENT DOCUMENTS

| 5,104,820 | A | | 4/1992 | Go et al. |
| 5,111,278 | A | * | 5/1992 | Eichelberger ......... H01L 23/473 257/698 |
| 5,517,754 | A | * | 5/1996 | Beilstein, Jr. ....... H01L 25/0657 257/777 |
| 5,596,226 | A | | 1/1997 | Beilstein, Jr. et al. |
| 5,789,302 | A | | 8/1998 | Mitwalsky et al. |
| 5,804,464 | A | | 9/1998 | Beilstein, Jr. et al. |
| 5,834,829 | A | | 11/1998 | Dinkel et al. |

(Continued)

FOREIGN PATENT DOCUMENTS

| CN | 101552214 A | 10/2007 |
| JP | 10233412 A | 9/1998 |

OTHER PUBLICATIONS

X.H. Liu, "Chip-packages—Interaction Modeling og Ultra Low-k/Copper Back End of Line", 3 pages, Yorktown, NY.

(Continued)

*Primary Examiner* — Daniel Whalen
*Assistant Examiner* — Suberr Chi
(74) *Attorney, Agent, or Firm* — Cantor Colburn LLP; Louis Percello (57) ABSTRACT

A volumetric integrated circuit manufacturing method is provided. The method includes assembling a slab element of elongate chips, exposing a wiring layer between adjacent elongate chips of the slab element, metallizing a surface of the slab element at and around the exposed wiring layer to form a metallized surface electrically coupled to the wiring layer and passivating the metallized surface to hermetically seal the metallized surface.

5 Claims, 7 Drawing Sheets

(56) References Cited

U.S. PATENT DOCUMENTS

| | | |
|---|---|---|
| 5,949,135 A | 9/1999 | Washida et al. |
| 6,022,791 A | 2/2000 | Cook et al. |
| 6,025,639 A | 2/2000 | Mitwalsky et al. |
| 6,084,287 A | 7/2000 | Mitwalsky et al. |
| 6,091,131 A | 7/2000 | Cook et al. |
| 7,098,676 B2 | 8/2006 | Landers et al. |
| 7,122,400 B2 | 10/2006 | Hanke |
| 7,317,250 B2 | 1/2008 | Koh et al. |
| 7,348,795 B2 | 3/2008 | Scheppler et al. |
| 7,477,535 B2 | 1/2009 | Lahtinen et al. |
| 7,642,173 B2 | 1/2010 | McDonald |
| 7,642,633 B2 | 1/2010 | Hirose et al. |
| 7,714,447 B2 | 5/2010 | Eigner et al. |
| 7,994,501 B2 | 8/2011 | Drost et al. |
| 8,178,416 B2 | 5/2012 | Simon et al. |
| 2003/0122220 A1 | 7/2003 | West |
| 2005/0026397 A1 | 2/2005 | Daubenspeck |
| 2008/0067690 A1 | 3/2008 | Kumagai |
| 2011/0068435 A1 | 3/2011 | Hudson |
| 2011/0285007 A1 | 11/2011 | Chi et al. |
| 2011/0309495 A1 | 12/2011 | Wang et al. |

OTHER PUBLICATIONS

T.M. Shaw, et al., "Experimental Determination of the Toughness of Crack Stop Structures", Apr. 28, 2012, 3 pages, Yorktown Heights, NY.

\* cited by examiner

VOLUMETRIC INTEGRATED CIRCUIT AND VOLUMETRIC INTEGRATED CIRCUIT MANUFACTURING METHOD

This invention was made with Government support under Contract No.: H98230-08-C-1468 awarded by Department of Defense. The Government has certain rights in this invention.

BACKGROUND

The present invention relates generally to volumetric integrated circuits and manufacturing methods therefore and, more specifically, to volumetric integrated circuits including hermetically passivated metallization.

Volumetric integrated circuit assembly processes involves the turning of chips sideways and the bonding of the chips together with a high-temperature adhesive in controlled-spacing chip-chip gaps. Further processing includes the metallization of the new top and bottom surfaces of the resulting assembly and the joining of a top chip and a bottom substrate (or package or circuit board) to the resulting assembly at the top and bottom surface metallization by way of flip-chip joining processes (e.g., with micro-solder bumps). Recently, however, it has been found that the metallizations of the new top and bottom surfaces require hermetic passivation, which leads to passivation cracking as the passivation crosses over the chip-chip gaps, and gap crossing wiring that presents thermal mismatch issues with the adhesive and causes adhesive outgassing.

SUMMARY

According to one embodiment of the present invention, a volumetric integrated circuit manufacturing method is provided. The method includes assembling a slab element of elongate chips, exposing a wiring layer between adjacent elongate chips of the slab element, metallizing a surface of the slab element at and around the exposed wiring layer to form a metallized surface electrically coupled to the wiring layer and passivating the metallized surface to hermetically seal the metallized surface.

According to another embodiment of the present invention, a volumetric integrated circuit manufacturing method is provided and includes forming a plurality of elongate chips, each comprising opposite major faces, two pairs of opposite minor faces and a wiring layer disposed on one of the major faces, assembling the plurality of elongate chips into a slab element such that each elongate chip is disposed with at least one major face adhered to a major face of an adjacent elongate chip and such that the slab element comprises opposite major faces, exposing a wiring layer between adjacent elongate chips at one of the major faces of the slab element, metallizing a surface of the one of the major faces of the slab element at and around the exposed wiring layer to form a metallized surface electrically coupled to the wiring layer and passivating the metallized surface to hermetically seal the metallized surface.

According to yet another embodiment of the present invention, a volumetric integrated circuit is provided and includes a plurality of elongate chips, each comprising opposite major faces, two pairs of opposite minor faces and a wiring layer disposed on one of the major faces and each being disposed with at least one major face adhered to a major face of an adjacent elongate chip and metallization of at least one of the opposite minor faces of at least one of the two pairs of opposite minor faces of each elongate chip, the metallization comprising a metal layer in contact with the corresponding wiring layer and hermetic passivation at least partially surrounding the metal layer.

Additional features and advantages are realized through the techniques of the present invention. Other embodiments and aspects are described in detail herein and are considered a part of the claimed invention. For a better understanding, refer to the description and to the drawings.

BRIEF DESCRIPTION OF THE SEVERAL VIEWS OF THE DRAWINGS

The forgoing and other features, and advantages of the embodiments are apparent from the following detailed description taken in conjunction with the accompanying drawings in which.

DETAILED DESCRIPTION

The disclosure provided below relates to volumetric or multi-dimensional integrated circuit manufacturing processes. In general, volumetric integrated circuits are formed from a plurality of elongate chips that may be known good die (KGD) application specific integrated circuits (ASICs), which are originally provided on a wafer. The wafer may include several dozen or several hundred of such elongate chips that are diced and formed into a slab of elongate chips.

Figure 1:
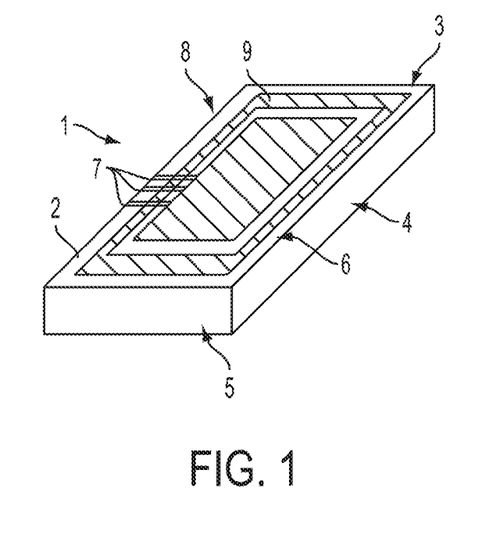
FIG. 1 is a perspective view of a elongate chip.

With reference to FIG. 1, each elongate chip 1 may be a long and narrow integrated circuit and includes a substrate body 2 having two opposite major faces 3, a first pair of opposite minor faces 4, which correspond to their diced edges, and a second pair of opposite minor faces 5. The elongate chips 1 may be rectangular such that the major faces 3 are rectangular and the minor faces 4 are longer than the minor faces 5. Each elongate chip 1 further includes a passivated wiring layer 6 operably disposed on one of the major faces 3. The wiring layer 6 includes multiple back end of line (BEOL) wiring levels (or features) in a central portion of the major face 3 as well as interconnections 7 that extend from the central portion to at least an edge portion 8 of the major face 3, which is defined along the longer minor faces 4. Each elongate chip 1 may further include crack-stop features 9, which may be disposed at the edge portion 8 below the interconnections 7. The crack-stop features 9 prevent moisture ingress and crack propagation of the substrate body 2 from the edge portion 8 toward the central portion.

Figure 2:
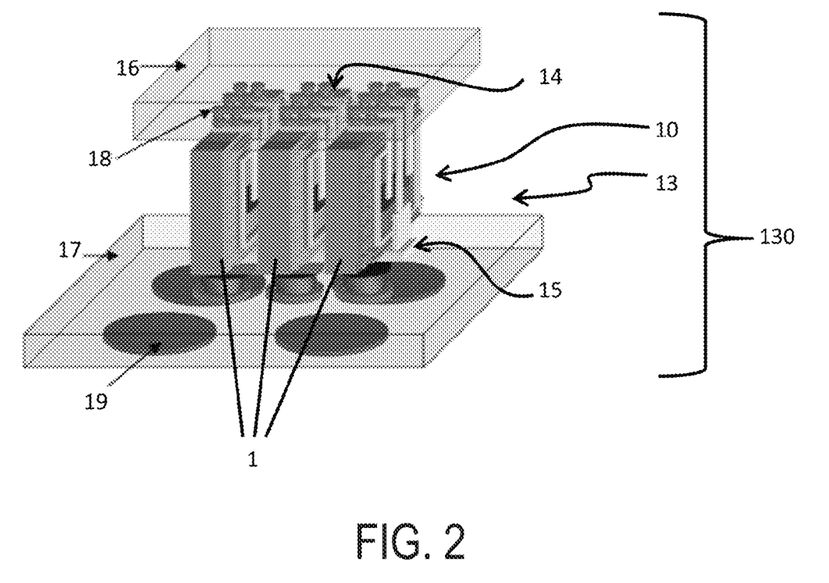
FIG. 2 is a perspective view of a slab element formed of a plurality of elongate chips.

With reference to FIGS. 1 and 2, the elongate chips 1 are assembled into a slab 10 of elongate chips 1. In accordance with embodiments, sixty-four elongate chips 1 may be assembled into the slab 10. Within the slab 10, each of the interior facing major faces 3 of each bookending elongate chip 1 is adhered to an opposite major face 3 of an adjacent elongate chip 1. That is, the elongate chips 1 are stacked with one another horizontally. For the interior elongate chips 1, each major face 3 is adhered to an opposite major face 3. The adhesive (e.g. polymer) is cured and the slab 10 is framed to form a slab element 13, which is representative of a full stack of elongate chips 1 and framing.

The slab element 13 has a top surface 14, which is formed of the longer minor faces 4 of each of the elongate chips 1 and the adhesive, and a bottom surface 15, which is formed of the opposite minor faces 4 of each of the elongate chips 1 and the adhesive. A top chip 16 and a bottom substrate (or package or circuit board) 17 are each operably coupled to the top surface 14 and the bottom surface 15 by way of controlled collapse chip connection (C4) grids 18 and LGAs 19 disposed between the minor faces 4 and the top chip 16 and the bottom chip 17 and hermetically passivated metallization to form a volumetric integrated circuit 130.

The hermetically passivated metallization is formed by way of the processes described below with reference to FIGS. 3-7 or FIGS. 8-13 and, additionally, FIGS. 14-17.

Figure 3:
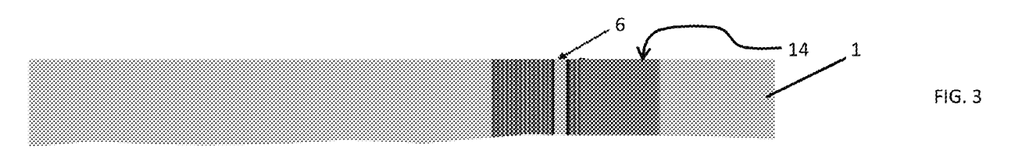
FIG. 3 is a side view of an initial stage of a formation of hermetically passivated metallization in accordance with embodiments.
Figure 4:
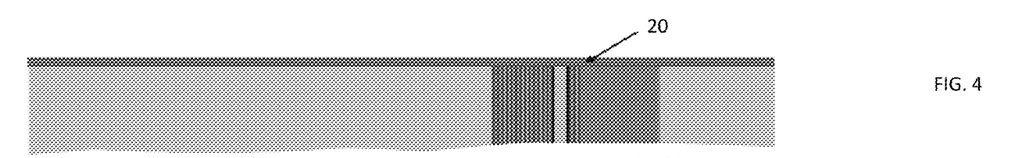
FIG. 4 is a side view of an intermediate stage of a formation of hermetically passivated metallization in accordance with embodiments.

With reference to FIGS. 3-7, an initial stage in the formation of the hermetically passivated metallization is that the slab 10 or slab element 13 (hereinafter referred to as the "slab element 13") of FIG. 2 is placed at rest on its bottom surface 15 so that the top surface 14 faces upwardly. As shown in FIG. 3, the top surface 14 is ground and polished so that the top surface 14 is substantially planarized with the wiring layers 6 exposed (only 1 is shown for clarity and brevity). The ground and polished top surface 14 is passivated to form a top surface passivation layer 20 as shown in FIG. 4. The top surface passivation layer 20 may be formed by plasma-enhanced chemical vapor deposition (PECVD) and may include interleaved silicon nitride and silicon oxide layers. A lower-most layer of the top surface passivation layer 20 may be a silicon nitride layer that is adjacent to the ground and polished top surface 14.

Figure 5:
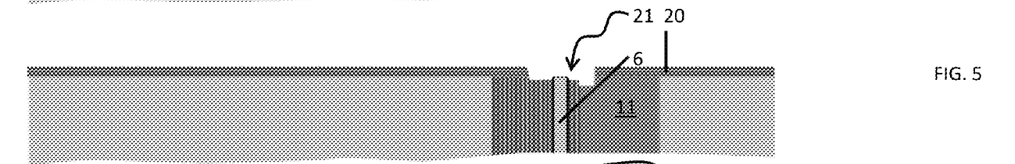
FIG. 5 is a side view of an intermediate stage of a formation of hermetically passivated metallization in accordance with embodiments.

As shown in FIG. 5, a lithographic process is executed to generate a laser-written vertical corner contact via 21, which is patterned and etched through the top surface passivation layer 20 at and around the wiring layers 6. This laser-written vertical corner contact via 21 extends laterally from the crack-stop features 9, across the wiring layer 6 and to the adhesive 11 between adjacent elongate chips 1. Exposed surfaces of the laser-written vertical corner contact via 21 are then cleaned by a reactive ion etch (RIE) process, a stripping process and/or an application of a dilute acid (DHF).

Figure 6:
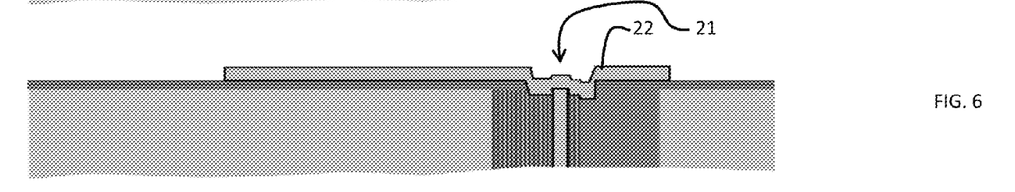
FIG. 6 is a side view of an intermediate stage of a formation of hermetically passivated metallization in accordance with embodiments

As shown in FIG. 6, a top surface metallization layer 22 is formed at and around the cleaned laser-written vertical corner contact via 21 to define a corner contact region. In accordance with various embodiments, the top surface metallization layer 22 may be formed by plasma vapor deposition (PVD) of argon along with one or more of titanium, titanium nitride, aluminum, copper or aluminum-copper alloy and by additional lithographic or etching processes. The top surface metallization layer 22 may be substantially uniformly thick so that a shape of a top surface of the top surface metallization layer 22 is reflective of a shape of the laser-written vertical corner contact via 21.

Figure 7:
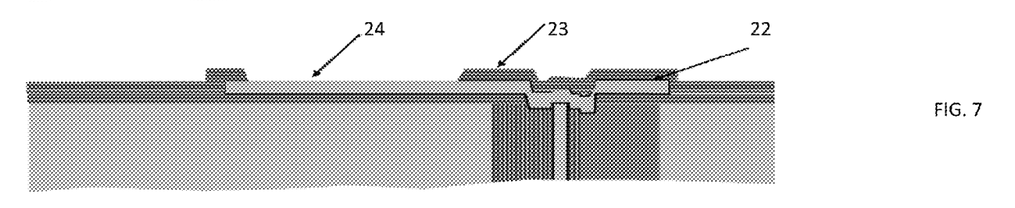
FIG. 7 is a side view of a final stage of a formation of hermetically passivated metallization in accordance with embodiments.

As shown in FIG. 7, a final stage in the process includes the formation of an uppermost passivation layer 23 over the top surface passivation layer 20 and portions of the top surface metallization layer 22. As with the top surface passivation layer 20, the uppermost passivation layer 23 may be formed by PECVD and may include interleaved silicon nitride and silicon oxide layers. An upper-most layer of the uppermost passivation layer 23 may be a silicon nitride layer such that silicon nitride layers bookend the top surface and uppermost passivation layers 20 and 23. Following formation of the uppermost passivation layer 23, the uppermost passivation layer 23 may be subject to lithographic (e.g., photosensitive polyimide (PSPI) deposition/exposure/curing) and etching processes for cleaning purposes. The uppermost passivation layer 23 may be formed to define an uppermost via 24 that is electrically communicative with the corresponding C4 grid 18.

Figure 8:
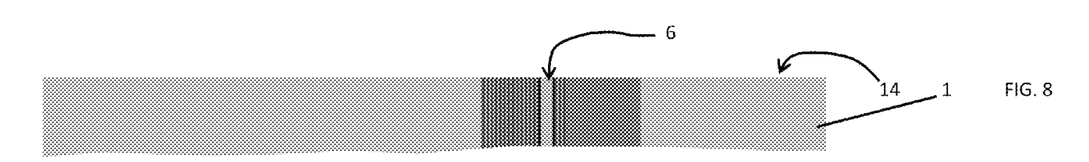
FIG. 8 is a side view of an initial stage of a formation of hermetically passivated metallization in accordance with alternative embodiments.
Figure 9:
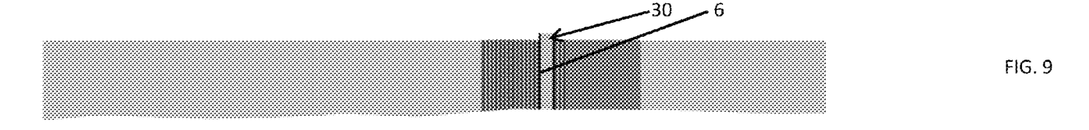
FIG. 9 is a side view of an intermediate stage of a formation of hermetically passivated metallization in accordance with alternative embodiments.
Figure 10:
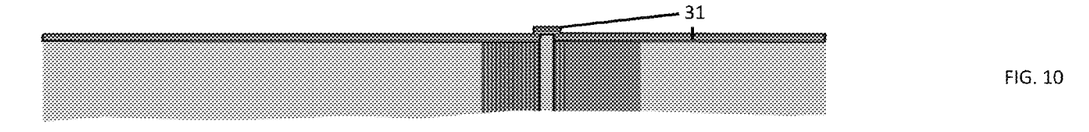
FIG. 10 is a side view of an intermediate stage of a formation of hermetically passivated metallization in accordance with alternative embodiments.

With reference to FIGS. 8-13, an initial stage in the formation of the hermetically passivated metallization is again that the slab element 13 of FIG. 2 is placed at rest on the bottom surface 15 so that the top surface 14 faces upwardly. As shown in FIG. 8, the top surface 14 is ground and polished so that the top surface 14 is substantially planarized with the wiring layers 6 exposed (only 1 is shown for clarity and brevity). The ground and polished top surface 14 is uniformly etched by way of RIE and DHF processes to expose a top portion 30 of each of the wiring layers 6, as shown in FIG. 9. The ground, polished and etched top surface 14 and the top portion 30 of each of the wiring layers 6 are then passivated to form a top surface passivation layer 31 as shown in FIG. 10. The top surface passivation layer 31 may be formed by plasma-enhanced chemical vapor deposition (PECVD) and may include interleaved silicon nitride and silicon oxide layers. A lower-most layer of the top surface passivation layer 31 may be a silicon nitride layer that is adjacent to the ground, polished and etched top surface 14.

Figure 11:
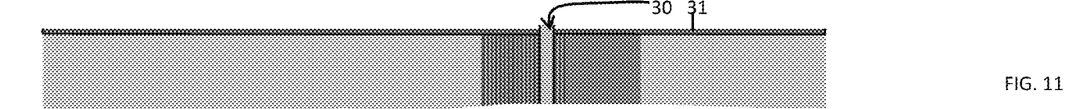
FIG. 11 is a side view of an intermediate stage of a formation of hermetically passivated metallization in accordance with alternative embodiments.
Figure 12:
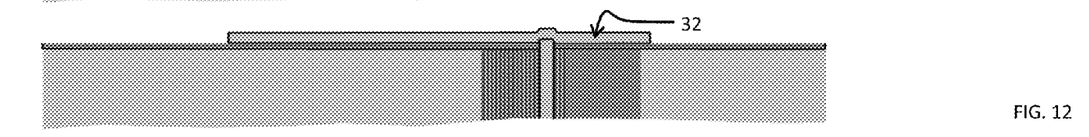
FIG. 12 is a side view of an intermediate stage of a formation of hermetically passivated metallization in accordance with alternative embodiments.

As shown in FIG. 11, the top surface passivation layer 31 is subjected to chemical mechanical polishing processes to re-expose the top portion 30 of each of the wiring layers 6 and cleaned. At this point, as shown in FIG. 12, a top surface metallization layer 32 is formed at and around the re-exposed top portions 30. In accordance with various embodiments, the top surface metallization layer 32 may be formed by plasma vapor deposition (PVD) of argon along with one or more of titanium, titanium nitride, aluminum, copper or aluminum-copper alloy and by additional lithographic or etching processes. The top surface metallization layer 32 may be substantially uniformly thick so that a shape of a top surface of the top surface metallization layer 32 is reflective of a shape of the top surface passivation layer 31 and the top portions 30.

Figure 13:
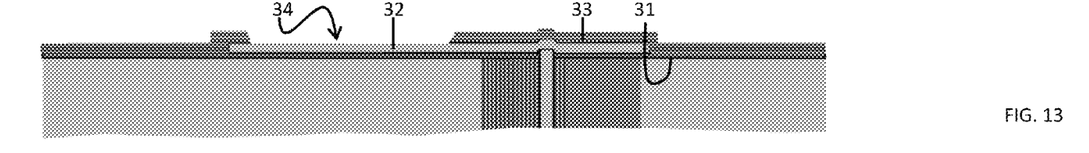
FIG. 13 is a side view of a final stage of a formation of hermetically passivated metallization in accordance with alternative embodiments.

As shown in FIG. 13, a final stage in the process includes the formation of an uppermost passivation layer 33 over the top surface passivation layer 31 and portions of the top surface metallization layer 32. As with the top surface passivation layer 31, the uppermost passivation layer 33 may be formed by PECVD and may include interleaved silicon nitride and silicon oxide layers. An upper-most layer of the uppermost passivation layer 33 may be a silicon nitride layer such that silicon nitride layers bookend the top surface and uppermost passivation layers 31 and 33. Following formation of the uppermost passivation layer 33, the uppermost passivation layer 33 may be subject to lithographic (e.g., photosensitive polyimide (PSPI) deposition/ exposure/curing) and etching processes for cleaning purposes. The uppermost passivation layer 33 may be formed to define an uppermost via 34 that is electrically communicative with the corresponding C4 grid 18.

With reference to FIGS. 14-17, further processing of hermetically passivated metallization may be conducted and may be equally applicable to the embodiments of FIGS. 3-7 or FIGS. 8-13. For purposes of clarity and brevity, however, FIGS. 14-17 are provided and relate to embodiments of the further processing that are applied to the embodiments of FIGS. 3-7.

Figure 14:
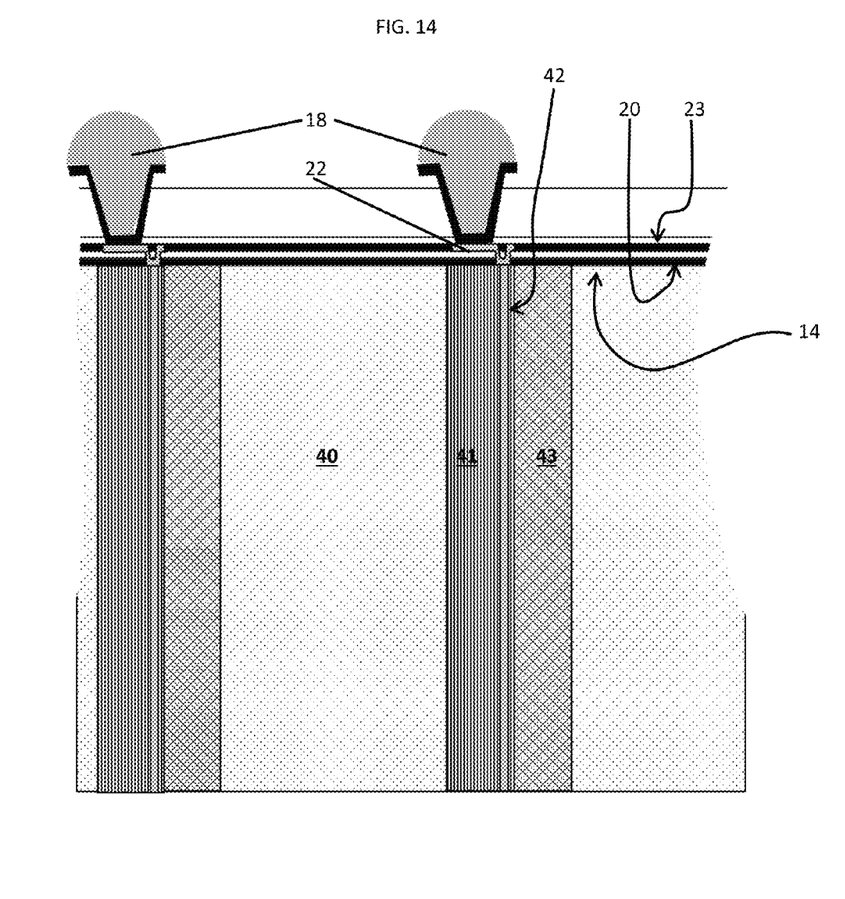
FIG. 14 is a side view of further processing of hermetically passivated metallization.

With reference to FIG. 14, each elongate chip 1 in the slab element 13 of FIG. 2 includes a silicon substrate layer 40, a BEOL stack 41 and a wiring layer 42 disposed within the BEOL stack 41. An additional layer of adhesive 43, such as an organic thermoset material, is disposed between the BEOL stack 41 and the silicon substrate layer 40 of adjacent elongate chips 1. The uppermost passivation layer 23 and the top surface passivation layer 20 are provided along the top surface 14 along with the top surface metallization layer 22, which is disposed in electrical contact with the wiring layer 42 to form a corner contact that is planarized and hermetically sealed by the dielectric materials of the uppermost passivation layer 23 and the top surface passivation layer 20. The top surface metallization layer 22 is further electrically connected to ball limiting metallurgy (BLM) and a C4 connection of the corresponding grid 18.

As shown in FIG. 14, the uppermost passivation layer 23 and the top surface passivation layer 20 may be formed to extend across and over the layer of adhesive 43. In this case, the top surface metallization layer 22 terminates at the edge of the BEOL stack 41 such that no portion of the top surface metallization layer 22 extends over the layer of adhesive 43.

Figure 15:
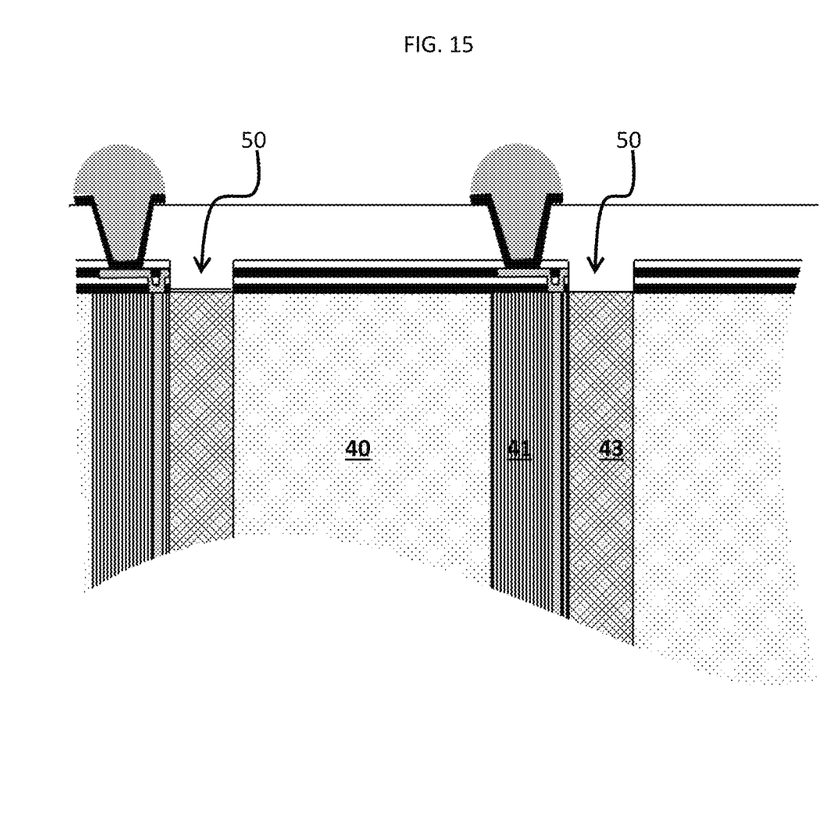
FIG. 15 is a side view of further processing of hermetically passivated metallization.
Figure 16:
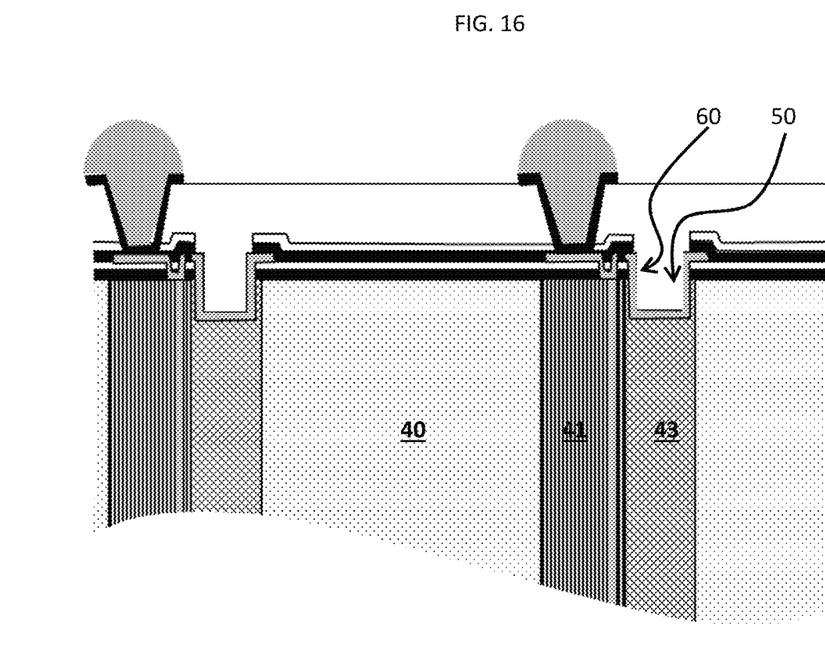
FIG. 16 is a side view of further processing of hermetically passivated metallization.
Figure 17:
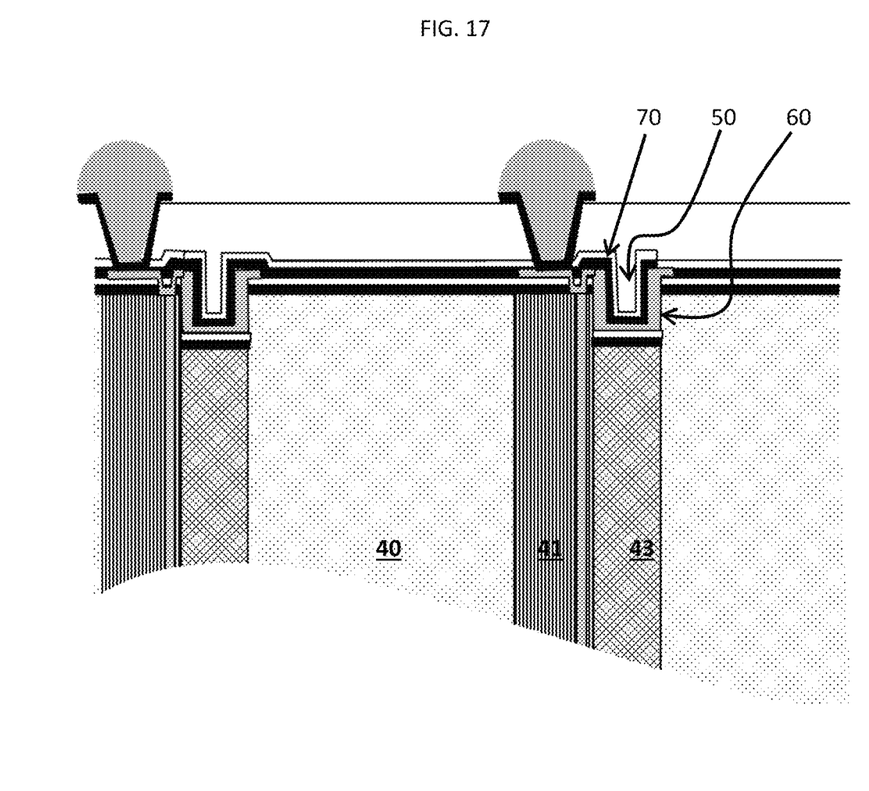
FIG. 17 is a side view of further processing of hermetically passivated metallization.

With reference to FIGS. 15-17, further processes toward additional embodiments exist. These include the definition and formation of ventilation and stress/strain relief slots 50 through the uppermost passivation layer 23 and the top surface passivation layer 20 over the layer of adhesive 43, as shown in FIG. 15, the disposition of a cap 60 in each of the ventilation and stress/strain relief slots 50, as shown in FIG. 16, and the formation of a cap passivation layer 70 over each of the caps 60. The caps 60 may be formed of metal or metallic alloys and are disposed to add mechanical support to the uppermost passivation layer 23 and the top surface passivation layer 20.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited. Many modifications and variations will be apparent to those of ordinary skill in the art without departing from the scope and spirit of the embodiments. The embodiments were chosen and described in order to best explain principles and practical application, and to enable others of ordinary skill in the art to understand the embodiments for various embodiments with various modifications as are suited to the particular use contemplated.

While the embodiments have been described, it will be understood that those skilled in the art, both now and in the future, may make various improvements and enhancements which fall within the scope of the claims which follow. These claims should be construed to maintain the proper protection for the embodiments first described.

What is claimed is:

1. A volumetric integrated circuit manufacturing method, comprising:
   forming a wiring layer on an elongate chip;
   assembling a slab element of the elongate chip and additional elongate chips such that the wiring layer is disposed between the elongate chip and an adjacent elongate chip of the additional elongate chips;
   exposing the wiring layer between the elongate chip and the adjacent elongate chip of the slab element;
   metallizing a surface of the slab element at and around the exposed wiring layer to form a metallized surface electrically coupled to the wiring layer; and
   passivating the metallized surface to hermetically seal the metallized surface,
   wherein the exposing comprises removing material that impedes exposure of the wiring layer from the surface of the slab element around the wiring layer, passivating the surface of the slab element and the wiring layer to form a passivation layer and removing a portion of the passivation layer at the wiring layer to expose the wiring layer through the passivation layer.

2. The volumetric integrated circuit manufacturing method according to claim 1, wherein the exposing comprises:
   passivating the surface of the slab element to form a passivation layer; and
   removing material that impedes exposure of the wiring layer from the passivation layer and the surface of the slab element at and around the wiring layer.

3. A volumetric integrated circuit manufacturing method, comprising:
   forming a plurality of elongate chips, each comprising:
       opposite major faces, a first pair of opposite minor faces that have a same width and a different length as the opposite major faces, a second pair of opposite minor faces that have a same length and a different width as the opposite major faces, a wiring layer disposed on one of the major faces as back end-of-line (BEOL) wiring levels at a central portion thereof, and as interconnections electrically coupled to the BEOL wiring levels at an edge portion thereof, and crack-stop features disposed below the interconnections at the edge portion;

assembling the plurality of elongate chips into a slab element such that each elongate chip is disposed with at least one major face adhered to a major face of an adjacent elongate chip and such that the slab element comprises opposite major faces formed of the first pairs of the opposite minor faces of each elongate chip;

exposing the interconnections of a wiring layer between adjacent elongate chips at one of the major faces of the slab element;

metallizing a surface of the one of the major faces of the slab element at and around the exposed interconnections of the wiring layer to form a metallized surface electrically coupled to the interconnections of the wiring layer; and passivating the metallized surface to hermetically seal the metallized surface.

4. The volumetric integrated circuit manufacturing method according to claim 3, wherein the exposing comprises:

passivating the surface of the one of the major faces of the slab element to form a passivation layer; and removing material that impedes exposure of the interconnections of the wiring layer from the passivation layer and the surface of the one of the major faces of the slab element at and around the wiring layer.

5. The volumetric integrated circuit manufacturing method according to claim 4, wherein the exposing comprises:

removing material that impedes exposure of the interconnections of the wiring layer from the surface of the one of the major faces of the slab element around the wiring layer;

passivating the surface of the one of the major faces of the slab element and the wiring layer to form a passivation layer; and removing a portion of the passivation layer at the wiring layer to expose the wiring layer through the passivation layer.

* * * * *